United States Patent
Huang

(10) Patent No.: US 11,758,709 B2
(45) Date of Patent: Sep. 12, 2023

(54) METHOD FOR PREPARING SEMICONDUCTOR DEVICE WITH EPITAXIAL STRUCTURES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 76 days.

(21) Appl. No.: 17/508,720

(22) Filed: Oct. 22, 2021

(65) Prior Publication Data

US 2022/0052050 A1 Feb. 17, 2022

Related U.S. Application Data

(62) Division of application No. 16/678,190, filed on Nov. 8, 2019.

(51) Int. Cl.
*H10B 12/00* (2023.01)

(52) U.S. Cl.
CPC ......... *H10B 12/31* (2023.02); *H10B 12/0335* (2023.02); *H10B 12/482* (2023.02); *H10B 12/488* (2023.02)

(58) Field of Classification Search
CPC ......... H01L 27/10808; H01L 27/10855; H01L 27/10885; H01L 27/10891
See application file for complete search history.

(56) References Cited

U.S. PATENT DOCUMENTS

| | | | |
|---|---|---|---|
| 2004/0142529 A1* | 7/2004 | Park | H10B 12/0335 257/E21.171 |
| 2012/0012926 A1 | 1/2012 | Ha et al. | |
| 2012/0286358 A1* | 11/2012 | Sammi | H10B 12/318 257/334 |
| 2015/0348974 A1 | 12/2015 | Narasimha et al. | |
| 2016/0027785 A1 | 1/2016 | Fujimoto | |
| 2021/0050259 A1* | 2/2021 | Xie | H01L 21/76885 |

FOREIGN PATENT DOCUMENTS

JP 2012019035 A 1/2012

OTHER PUBLICATIONS

Office Action dated May 25, 2022 related to U.S. Appl. No. 16/678,190, wherein this application is a DIV of U.S. Appl. No. 16/678,190.
Office Action dated Mar. 22, 2022 related to U.S. Appl. No. 16/678,190, wherein this application is a DIV of U.S. Appl. No. 16/678,190.
Office Action dated Mar. 3, 2023 related to U.S. Appl. No. 16/678,190, wherein this application is a DIV of U.S. Appl. No. 16/678,190.

\* cited by examiner

*Primary Examiner* — Kenneth Parker
*Assistant Examiner* — Christopher A Culbert
(74) *Attorney, Agent, or Firm* — Xuan Zhang

(57) ABSTRACT

The present disclosure relates to a method for preparing a semiconductor device. The method includes forming a source region and a drain region in a semiconductor substrate, and forming a bit line over the source region. The method also includes growing a first epitaxial structure over the drain region. A top surface of the first epitaxial structure is higher than a bottom surface of the bit line. The method further includes forming a capacitor contact over the first epitaxial structure.

4 Claims, 10 Drawing Sheets

METHOD FOR PREPARING SEMICONDUCTOR DEVICE WITH EPITAXIAL STRUCTURES

CROSS-REFERENCE TO RELATED APPLICATION

This application is a divisional application of U.S. Non-Provisional application Ser. No. 16/678,190 filed Nov. 8, 2019, which is incorporated herein by reference in its entirety.

TECHNICAL FIELD

The present disclosure relates to a method for preparing a semiconductor device, and more particularly, to a method for preparing a semiconductor device with epitaxial structures.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced so that the packing densities of these DRAMs have increased considerably. However, as DRAM memory cell dimension requirements dictate decreased sizes, capacitive coupling is becoming an increasingly important issue which results in increased parasitic capacitance. Accordingly, the speeds of DRAM memory cells are undesirably slowed down and the overall device performance is being negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a source region and a drain region formed in a semiconductor substrate, and a bit line formed over the source region. The semiconductor device also includes a first epitaxial structure formed over the drain region, and a capacitor contact formed over the first epitaxial structure. A bottom surface of the capacitor contact is higher than a bottom surface of the bit line.

In some embodiments, a top surface of the capacitor contact is higher than a top surface of the bit line.

In some embodiments, the semiconductor device further comprises a dielectric cap layer formed over the bit line, wherein the top surface of the capacitor contact is level with a top surface of the dielectric cap layer.

In some embodiments, the semiconductor device further comprises a second epitaxial structure formed in the semiconductor substrate, wherein the second epitaxial structure is covered by the bit line and surrounded by the source region.

In some embodiments, a bottom surface of the first epitaxial structure is higher than a bottom surface of the second epitaxial structure.

In some embodiments, the semiconductor device further comprises a first spacer formed adjacent to sidewalls of the bit line and a second spacer formed adjacent to sidewalls of the capacitor contact, wherein the first spacer extends into the semiconductor substrate and against sidewalls of the second epitaxial structure, and wherein the second spacer is formed adjacent to the first epitaxial structure.

In some embodiments, the semiconductor device further comprises a buffer layer formed over the source region and the drain region, wherein the bottom surface of the capacitor contact is higher than a top surface of the buffer layer.

In another embodiment of the present disclosure, a semiconductor device is provided. The semiconductor device includes a source region and a drain region formed in a semiconductor substrate, and a bit line formed over the source region. The semiconductor device also includes a first dielectric cap layer formed over the bit line, and a first epitaxial structure formed over the drain region. The semiconductor device further includes a capacitor contact formed over the first epitaxial structure. A top surface of the first epitaxial structure is higher than a bottom surface of the bit line, and a top surface of the capacitor contact is level with a top surface of the first dielectric cap layer.

In some embodiments, the semiconductor device further comprises a second epitaxial structure covered by the bit line, wherein the second epitaxial structure penetrates through the source region, and wherein the first epitaxial structure and the second epitaxial structure include silicon.

In some embodiments, the semiconductor device further comprises a spacer formed adjacent to sidewalls of the first dielectric cap layer, wherein the spacer extends to cover sidewalls of the bit line and sidewalls of the second epitaxial structure.

In some embodiments, the second epitaxial structure is separated from the source region by the spacer.

In some embodiments, the semiconductor device further comprises a buffer layer covering the source region and the drain region, wherein a top surface of the buffer layer is level with the bottom surface of the bit line.

In some embodiments, the top surface of the first epitaxial structure is higher than the top surface of the buffer layer.

In some embodiments, the semiconductor device further comprises a word line formed in the semiconductor substrate; and a second dielectric cap layer formed over the word line, wherein the second dielectric cap layer is covered by the first dielectric cap layer, and the second dielectric cap layer is between the source region and the drain region.

In one embodiment of the present disclosure, a method for forming a semiconductor device is provided. The method includes forming a source region and a drain region in a semiconductor substrate, and forming a bit line over the source region. The method also includes growing a first epitaxial structure over the drain region. A top surface of the first epitaxial structure is higher than a bottom surface of the bit line. The method further includes forming a capacitor contact over the first epitaxial structure.

In some embodiments, the method for forming a semiconductor device further comprises: forming a buffer layer covering the source region and the drain region; partially removing the buffer layer and the source region to form a first opening; and growing a second epitaxial structure in the first opening before the bit line is formed.

In some embodiments, the method for forming a semiconductor device further comprises: forming a conductive layer over the second epitaxial structure; forming a dielectric cap layer partially covering the conductive layer; and etching the conductive layer and the second epitaxial structure using the dielectric cap layer as a mask such that the bit line is formed, wherein the second epitaxial structure is separated from the source region and the buffer layer by a gap after the bit line is formed.

In some embodiments, the method for forming a semiconductor device further comprises: forming an interlayer dielectric (ILD) structure surrounding the bit line; and partially removing the ILD structure to form a second opening exposing the drain region.

In some embodiments, the first epitaxial structure is grown in the second opening.

In some embodiments, the method for forming a semiconductor device further comprises: forming a spacer lining sidewalls of the second opening after the first epitaxial structure is formed, wherein the capacitor contact is formed over and in direct contact with the first epitaxial structure, and the capacitor contact is surrounded by the spacer.

Embodiments of a semiconductor device are provided in accordance with some embodiments of the disclosure. The semiconductor device includes a bit line over a source region, an epitaxial structure over a drain region, and a capacitor contact over the epitaxial structure, such that a bottom surface of the capacitor contact is higher than a bottom surface of the bit line. Since there is a vertical offset between a bit line contact under the bit line and the capacitor contact, the capacitance between the bit line contact and the capacitor contact may be reduced. As a result, the operation speeds of the semiconductor device may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
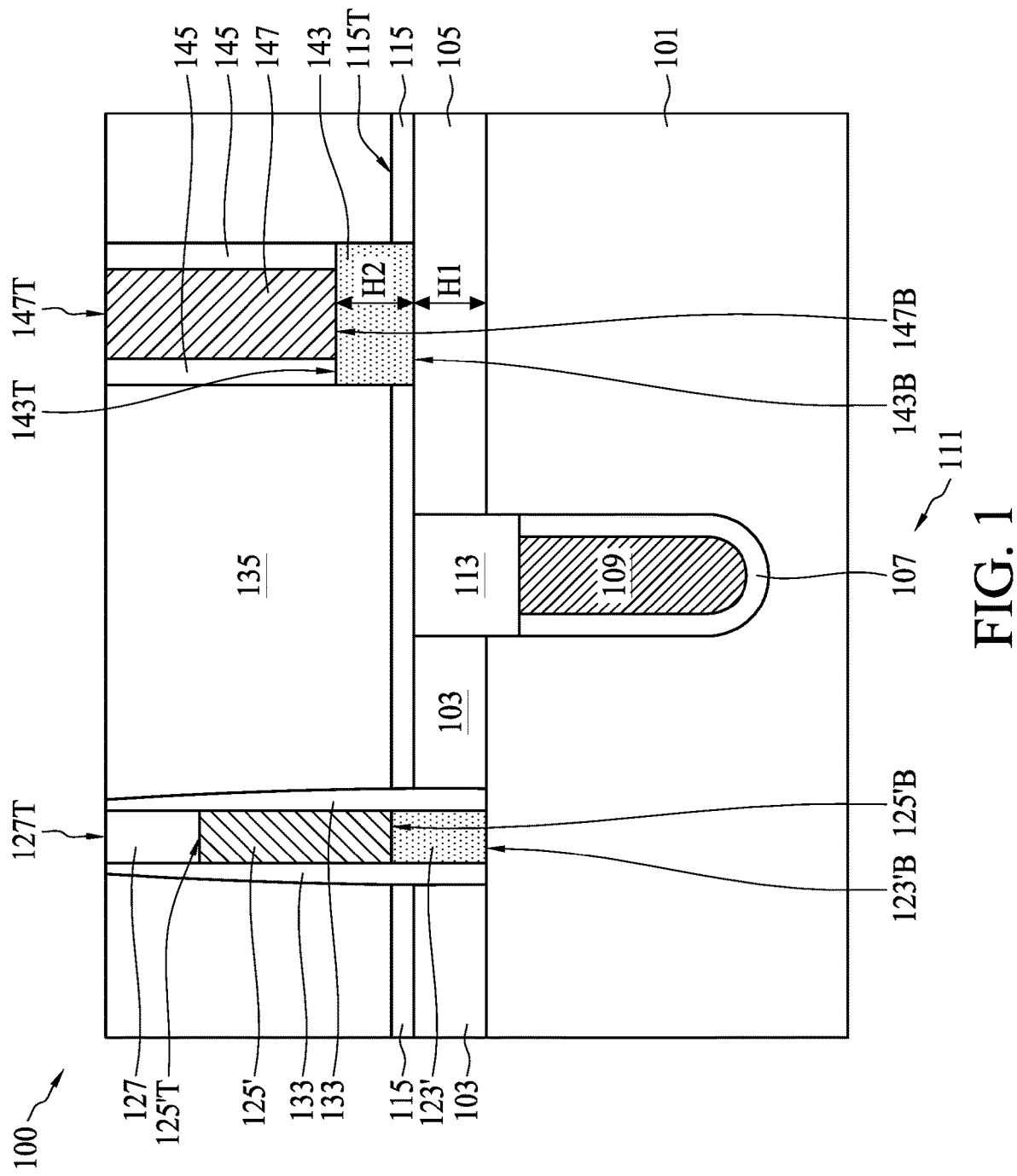
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a word line 111 (i.e., gate structure) in a semiconductor substrate 101, in accordance with some embodiments. More specifically, the word line 111 includes a gate electrode 109 and a gate dielectric layer 107 surrounding the gate electrode 109. Moreover, the semiconductor device 100 also includes a source region 103, a drain region 105, and a dielectric cap layer 113 in the semiconductor substrate 101. In some embodiments, the dielectric cap layer 113 is over the word line 111 and between the source region 103 and the drain region 105. In some embodiments, the source region 103 and the drain region 105 adjoin the dielectric cap layer 113, and the gate electrode 109 and the gate dielectric layer 107 are covered by the dielectric cap layer 113.

Still referring to FIG. 1, the semiconductor device 100 includes a buffer layer 115 over the source region 103, the drain region 105 and the dielectric cap layer 113. In some embodiments, the semiconductor device 100 includes an epitaxial structure 123' in the semiconductor substrate 101 and surrounded by the source region 103, a bit line 125' over the epitaxial structure 123', and a dielectric cap layer 127 over the bit line 125'. Moreover, the semiconductor device 100 also includes spacers 133 adjacent to opposite sidewalls of the dielectric cap layer 127, opposite sidewalls of the bit line 125', and opposite sidewalls of the epitaxial structure 123'.

In addition, the semiconductor device 100 includes another epitaxial structure 143 over the drain region 105, a capacitor contact 147 over the epitaxial structure 143, and spacers 145 adjacent to opposite sidewalls of the capacitor contact 147, in accordance with some embodiments. More specifically, in some embodiments, the buffer layer 115 is penetrated by the epitaxial structure 143, and the spacers 145 are positioned over the top surface 143T of the epitaxial structure 143. In some embodiments, the semiconductor device 100 also includes an interlayer dielectric (ILD) structure 135 surrounding the bit line 125', the dielectric cap layer 127, the capacitor contact 147, the epitaxial structure 143, and the spacers 133 and 145.

In some embodiments, the bottom surface 147B of the capacitor contact 147 is in direct contact with the top surface 143T of the epitaxial structure 143, and the bottom surface 147B of the capacitor contact 147 (or the top surface 143T of the epitaxial structure 143) is higher than the bottom surface 125'B of the bit line 125' and the top surface 115T of the buffer layer 115. In some embodiments, the bottom surface 125'B of the bit line 125' is level with the top surface 115T of the buffer layer 115.

Moreover, in some embodiments, the top surface 147T of the capacitor contact 147 is higher than the top surface 125'T of the bit line 125'. In some embodiments, the top surface 147T of the capacitor contact 147 is level with the top surface 127T of the dielectric cap layer 127. In some embodiments, the bottom surface 143B of the epitaxial structure 143 is higher than the bottom surface 123'B of the epitaxial structure 123'. In some embodiments, the semiconductor device 100 is a dynamic random access memory (DRAM).

Figure 2:
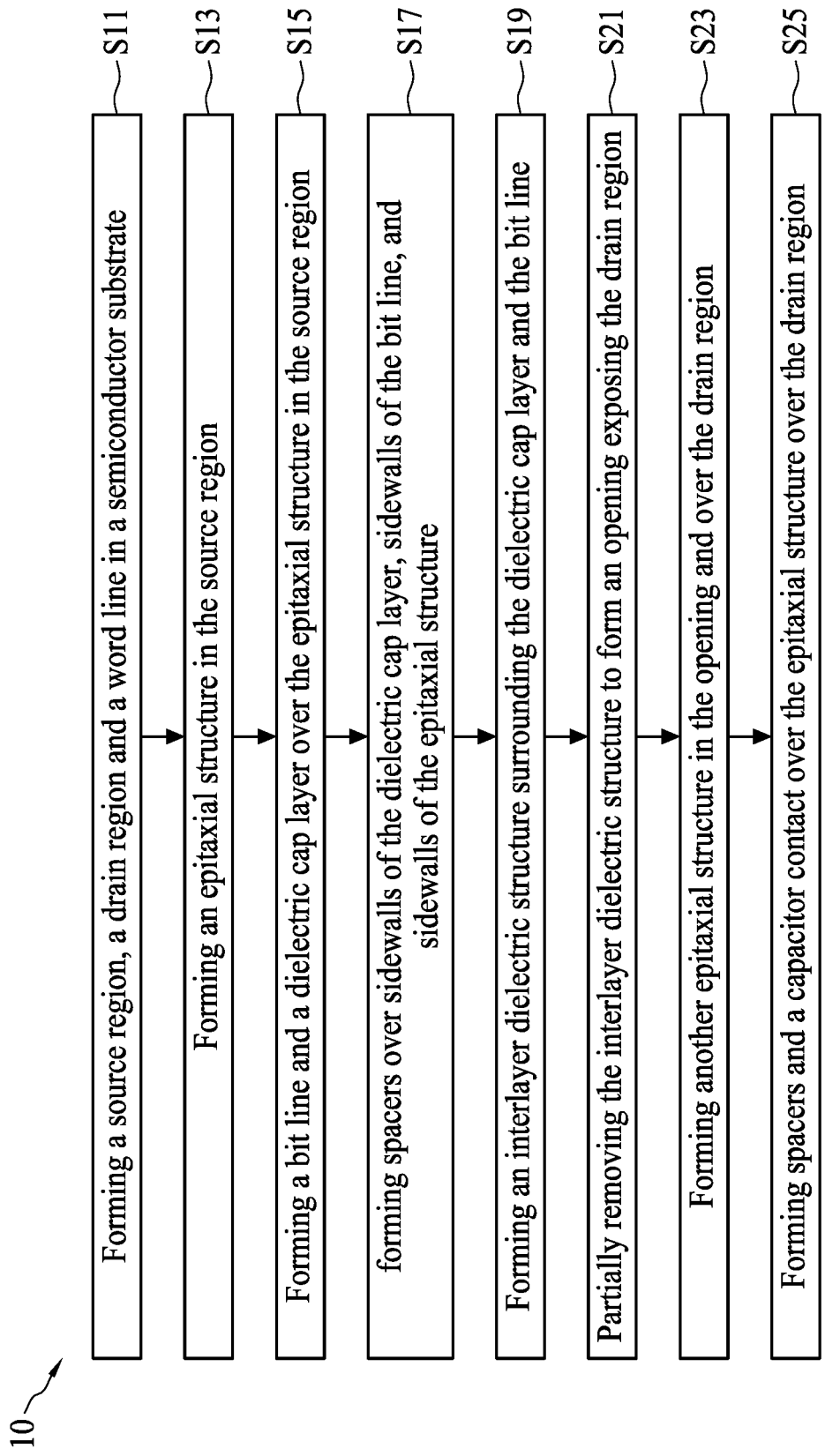
FIG. 2 is a flow diagram illustrating a method of forming a semiconductor device, in accordance with some embodiments.

FIG. 2 is a flow diagram illustrating a method 10 of forming the semiconductor device 100, and the method 10 includes steps S11, S13, S15, S17, S19, S21, S23 and S25, in accordance with some embodiments. The steps S11 to S25 of FIG. 2 are elaborated in connection with the following figures.

FIGS. 3 to 10 are cross-sectional views illustrating intermediate stages in the formation of the semiconductor device 100, in accordance with some embodiments.

Figure 3:
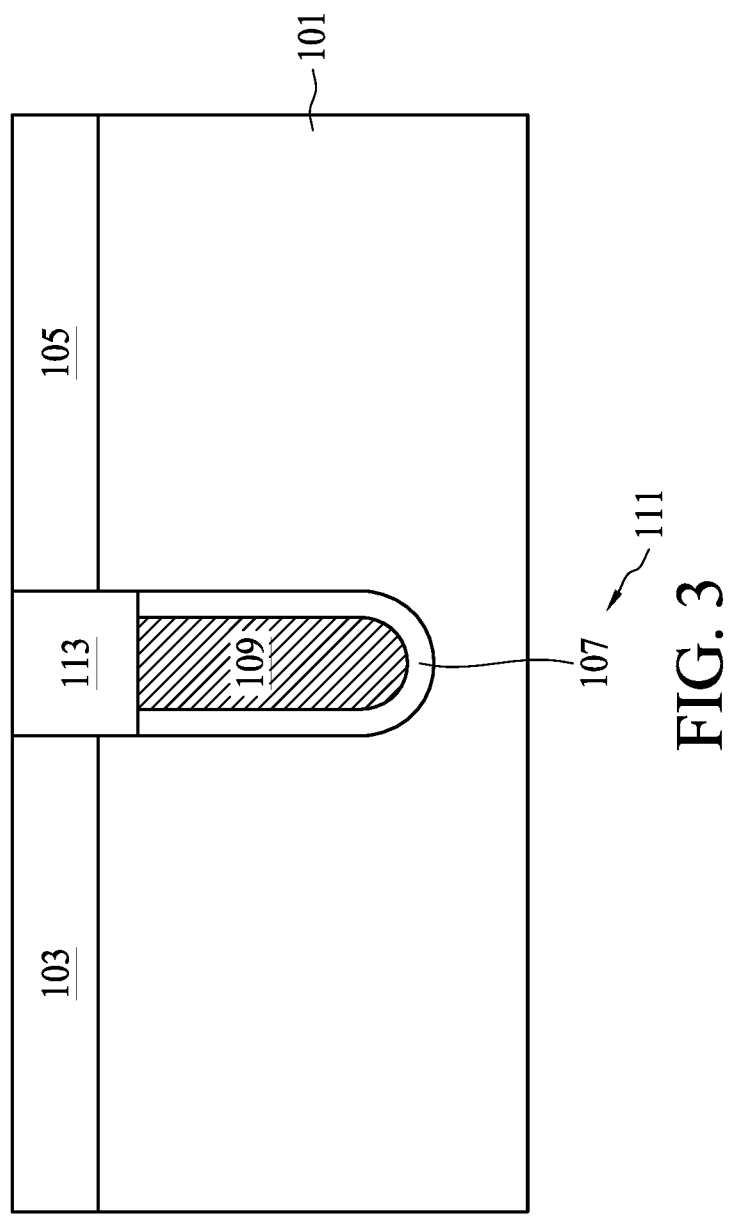
FIG. 3 is a cross-sectional view illustrating an intermediate stage in the formation of a semiconductor device, in accordance with some embodiments.

As shown in FIG. 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIG. 3, the word line 111 including the gate electrode 109 and the gate dielectric layer 107 is formed in the semiconductor substrate 101, and the dielectric cap layer 113 is formed over the word line 111. In some embodiments, the gate electrode 109 is made of a conductive material such as aluminum (Al), copper (Cu), tungsten (W), titanium (Ti), tantalum (Ta), or another applicable material, and the gate dielectric layer 107 is made of silicon oxide, silicon nitride, silicon oxynitride, a dielectric material with high dielectric constant (high-k), or a combination thereof. In some embodiments, the dielectric cap layer 113 incudes silicon oxide, silicon nitride, silicon oxynitride, or a combination thereof.

In some embodiments, the word line 111 and the dielectric cap layer 113 are formed by etching and deposition processes. First, a trench is formed in the semiconductor substrate 101 by an etching process. The etching process may include a dry etching process, a wet etching process, or a combination thereof. After the trench is formed, deposition processes may be performed to form the word line 111 in the trench, and the deposition processes may include a chemical vapor deposition (CVD) process, a physical vapor deposition (PVD) process, a spin-coating process, or another applicable process. After performing the deposition processes, an etch-back process may be performed, and the dielectric cap layer 113 may be formed by performing a deposition process, such as CVD, PVD or spin coating. Next, a planarization process, such as chemical mechanical polishing (CMP), may be performed such that the top surface of the dielectric cap layer 113 is coplanar with the top surface of the semiconductor substrate 101.

In addition, the source region 103 and the drain region 105 are formed in the semiconductor substrate 101 by one or more ion implantation processes, and P-type dopants, such as boron (B) or $BF_2$, or N-type dopants, such as phosphorous (P) or arsenic (As), can be implanted in the semiconductor substrate 101. The source region 103 and the drain region 105 adjoin opposite sidewalls of the dielectric cap layer 113. The respective step is illustrated as the step S11 in the method 10 shown in FIG. 2.

Figure 4:
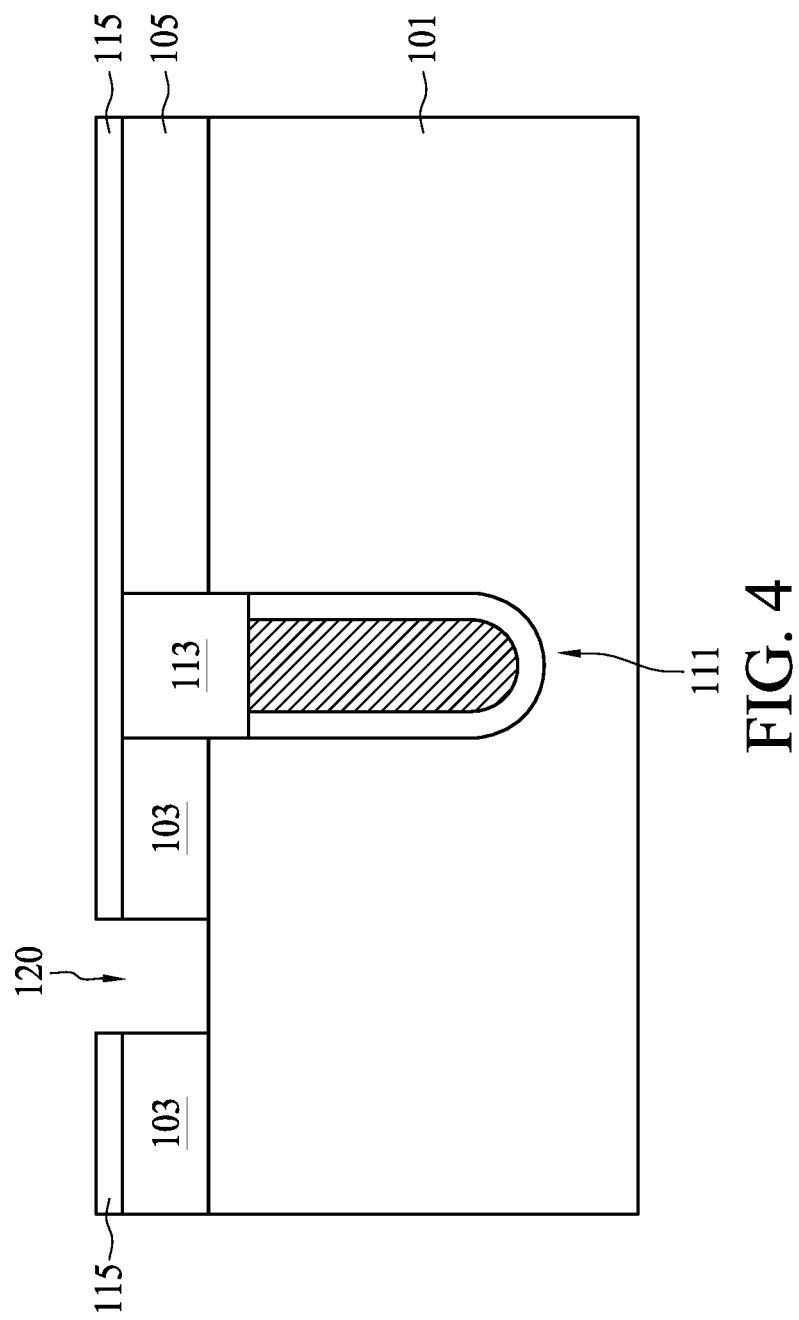
FIG. 4 is a cross-sectional view illustrating an intermediate stage in the formation of a semiconductor device, in accordance with some embodiments.

Next, the buffer layer 115 is formed over the semiconductor substrate 101, and the buffer layer 115 and the source region 103 are partially removed to form an opening 120, as shown in FIG. 4 in accordance with some embodiments. In some embodiments, the source region 103 and the drain region 105 are covered by the buffer layer 115. The buffer layer 115 may be a single layer or multiple layers. In some embodiments, the buffer layer 115 includes silicon oxide, silicon nitride, silicon oxynitride, or a combination thereof. In addition, the buffer layer 115 may be formed by a deposition process, such as CVD, PVD or spin coating.

After the buffer layer 115 is formed, an etching process may be performed to partially remove the buffer layer 115 and the source region 103. The etching process may include a dry etching process, a wet etching process, or a combination thereof. After the etching process, the opening 120 is formed, and the sidewalls of the buffer layer 115 and the sidewalls of the source region 103 are exposed in the opening 120.

Figure 5:
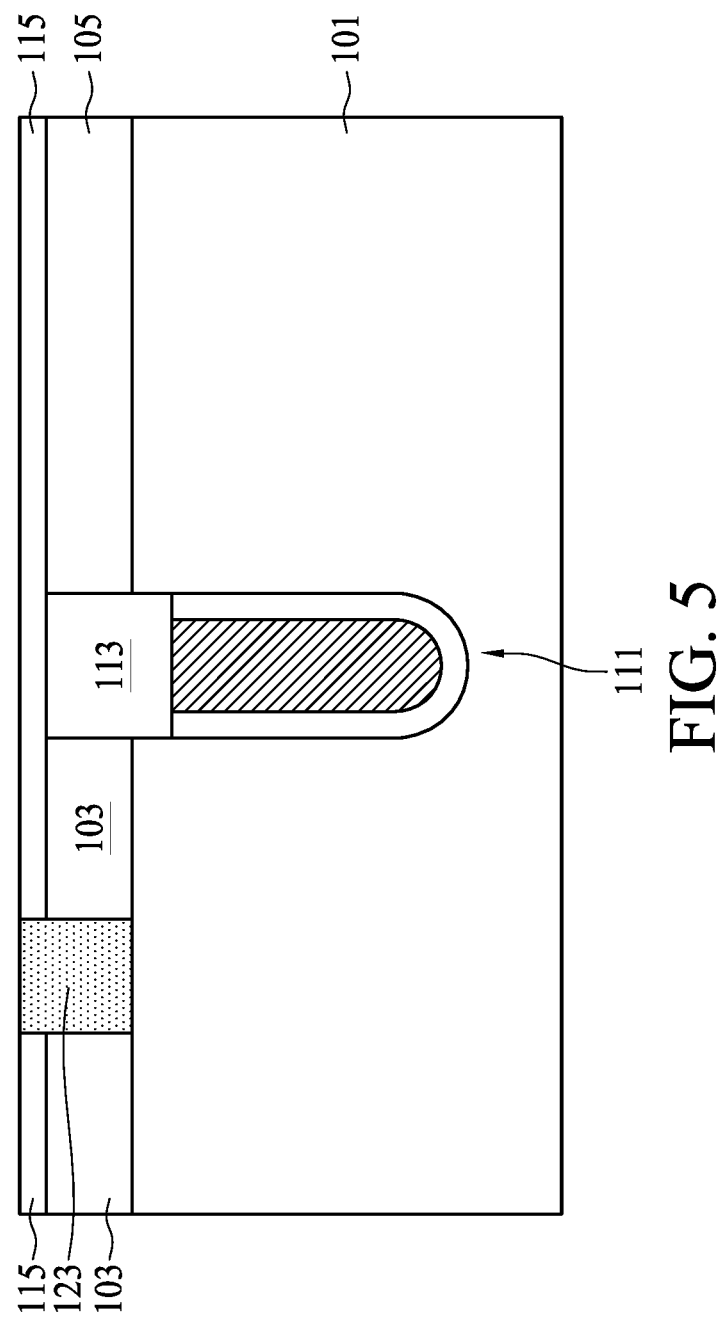
FIG. 5 is a cross-sectional view illustrating an intermediate stage in the formation of a semiconductor device, in accordance with some embodiments.

Next, the epitaxial structure 123 is formed in the opening 120, as shown in FIGS. 4 and 5 in accordance with some embodiments. The respective step is illustrated as the step S13 in the method 10 shown in FIG. 2. In some embodiments, the epitaxial structure 123 includes silicon, and the epitaxial structure 123 is epitaxially grown to fill the opening 120. It should be noted that the epitaxial structure 123 is surrounded by the source region 103 and the buffer layer 115.

Figure 6:
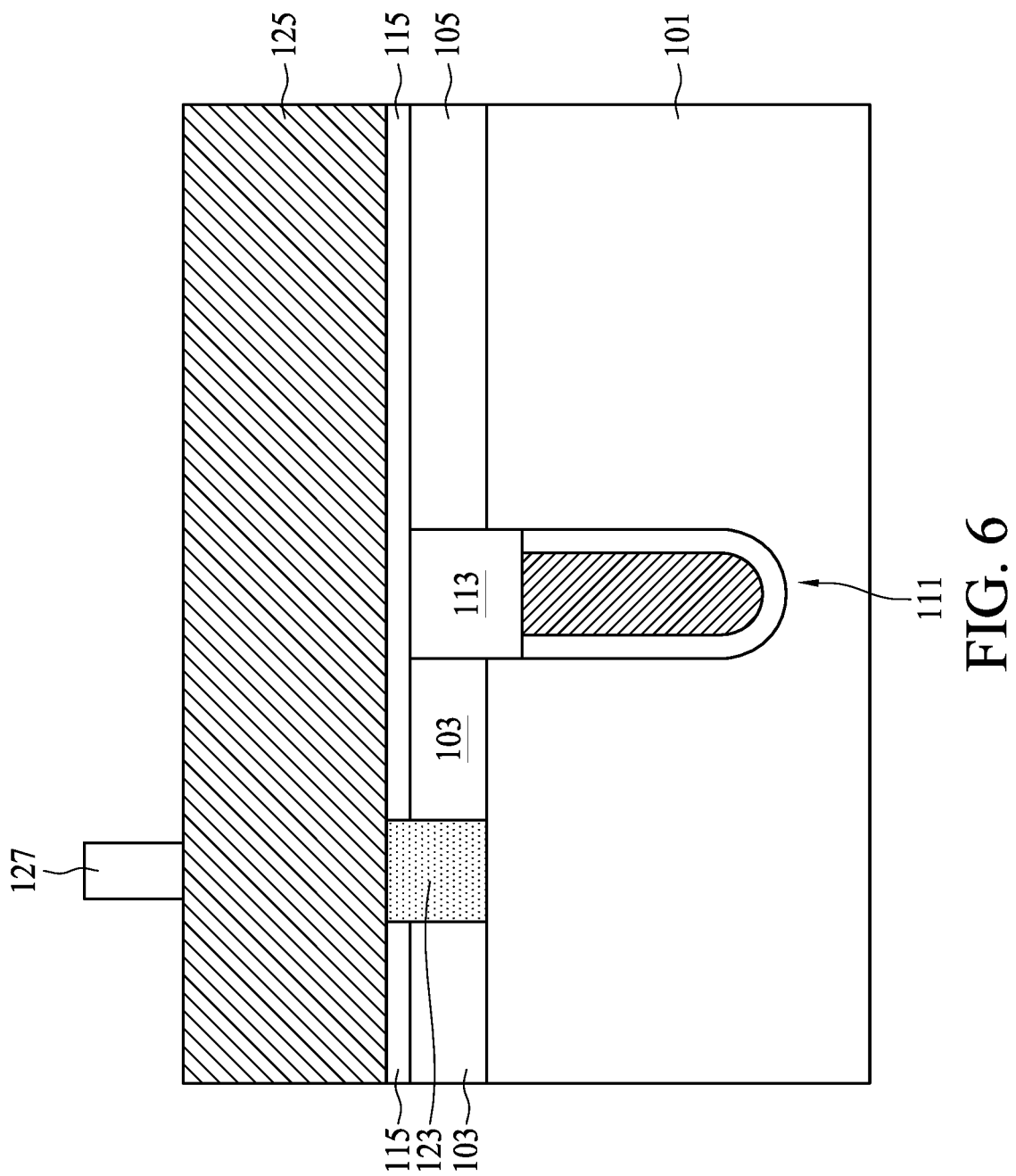
FIG. 6 is a cross-sectional view illustrating an intermediate stage in the formation of a semiconductor device, in accordance with some embodiments.

After the epitaxial structure 123 is formed, a conductive layer 125 is formed over the epitaxial structure 123 and the buffer layer 115, and a dielectric cap layer 127 is formed over the conductive layer 125, as shown in FIG. 6 in accordance with some embodiments. In some embodiments, the conductive layer 125 includes tungsten (W), aluminum (Al), copper (Cu), nickel (Ni), cobalt (Co), poly-crystalline silicon, another conductive material, or a combination thereof. In some embodiments, the conductive layer 125 is formed by a deposition process. The deposition process may include an electroplating process, a CVD process, a PVD process, a spin-coating process, an electroless plating process, or another applicable process.

In addition, in some embodiments, the dielectric cap layer 127 includes silicon oxide, silicon nitride, silicon oxynitride, or a combination thereof. In some embodiments, the dielectric cap layer 127 is formed by a deposition process and an etching process. It should be noted that the dielectric cap layer 127 is directly over the epitaxial structure 123.

Figure 7:
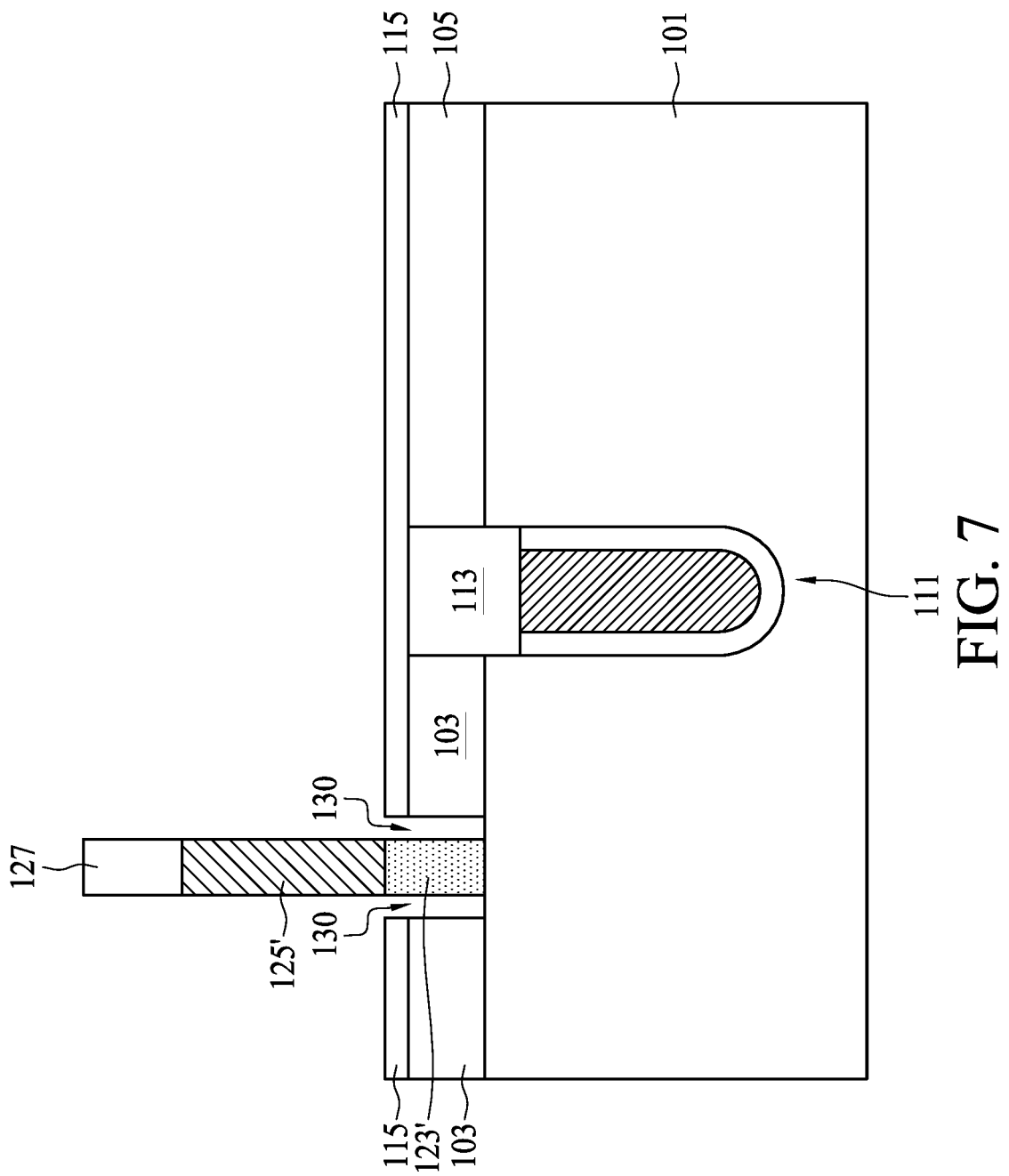
FIG. 7 is a cross-sectional view illustrating an intermediate stage in the formation of a semiconductor device, in accordance with some embodiments.

Next, the conductive layer 125 and the epitaxial structure 123 are patterned using the dielectric cap layer 127 as an etch mask to form the bit line 125' and the remaining epitaxial structure 123', as shown in FIG. 7 in accordance with some embodiments. As a result, the remaining epitaxial structure 123' is separated from the source region 103 and the buffer layer 115 by gaps 130. In some embodiments, the remaining epitaxial structure 123' is used as the bit line contact. The respective step is illustrated as the step S15 in the method 10 shown in FIG. 2.

Figure 8:
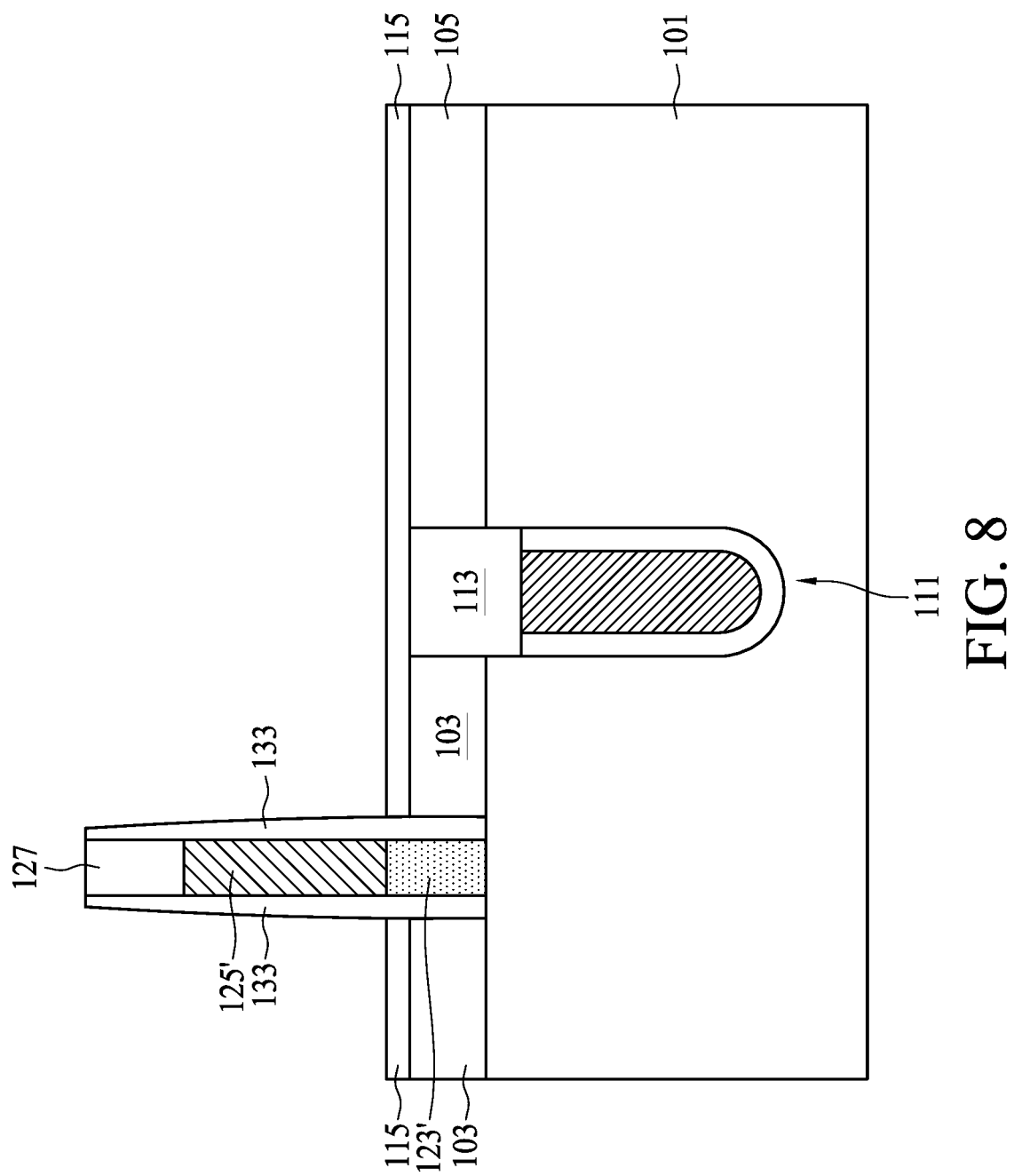
FIG. 8 is a cross-sectional view illustrating an intermediate stage in the formation of a semiconductor device, in accordance with some embodiments.

Next, spacers 133 are formed adjacent to opposite sidewalls of the dielectric cap layer 127, opposite sidewalls of the bit line 125', and opposite sidewalls of the remaining epitaxial structure 123', as shown in FIG. 8 in accordance with some embodiments. The respective step is illustrated as the step S17 in the method 10 shown in FIG. 2. In some embodiments, the gaps 130 are filled by the spacers 133.

In some embodiments, the spacers 133 include silicon oxide, silicon nitride, silicon oxynitride, or a combination thereof. In addition, in some embodiments, a spacer material (not shown) is formed to conformally cover the top surface of the buffer layer 115, the sidewalls of the bit line 125', and the top surface and sidewalls of the dielectric cap layer 127. Next, an etch-back process is performed on the spacer material until the top surface of the dielectric cap layer 127 and the top surface of the buffer layer 115 are exposed, thereby forming the spacers 133.

Figure 9:
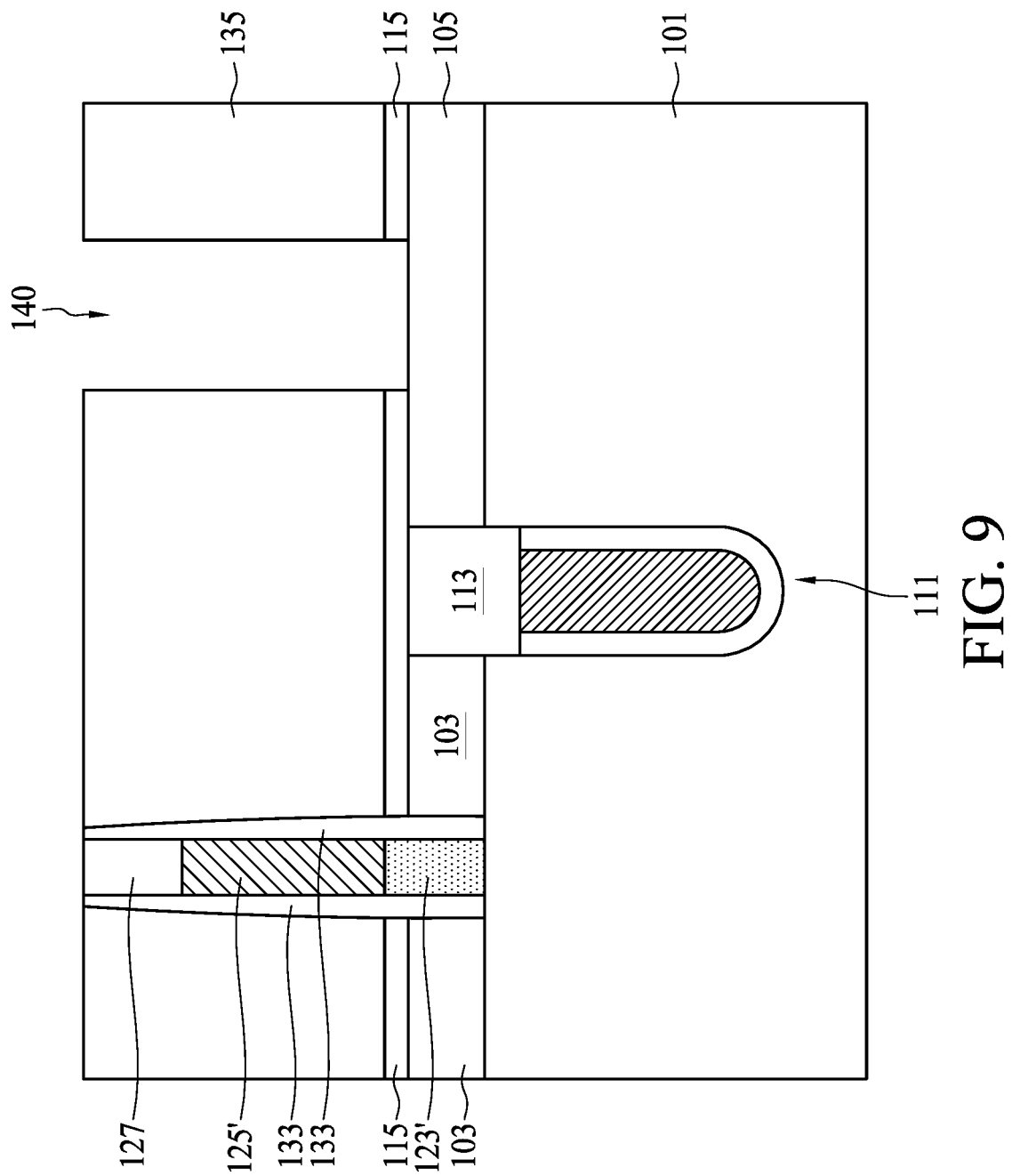
FIG. 9 is a cross-sectional view illustrating an intermediate stage in the formation of a semiconductor device, in accordance with some embodiments.

After the spacers 133 are formed, the interlayer dielectric (ILD) structure 135 is formed to cover the buffer layer 115, and the spacers 133, the bit line 125' and the dielectric cap layer 127 are surrounded by the ILD structure 135, as shown in FIG. 9 in accordance with some embodiments. The respective step is illustrated as the step S19 in the method 10 shown in FIG. 2. Next, the ILD structure 135 and the buffer layer 115 are partially removed to form an opening 140 exposing the drain region 105, as shown in FIG. 9 in accordance with some embodiments. The respective step is illustrated as the step S21 in the method 10 shown in FIG. 2.

In some embodiments, the ILD structure 135 is made of silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 135 may be formed by CVD, PVD, atomic layer deposition (ALD), spin coating, or another applicable process.

In some embodiments, the opening 140 is formed by an etching process, which uses a patterned layer as a mask, wherein the etching process includes a dry etching process, a wet etching process, or a combination thereof. It should be noted that the sidewalls of the ILD structure 135 and the sidewalls of the buffer layer 115 are exposed by the opening 140.

Figure 10:
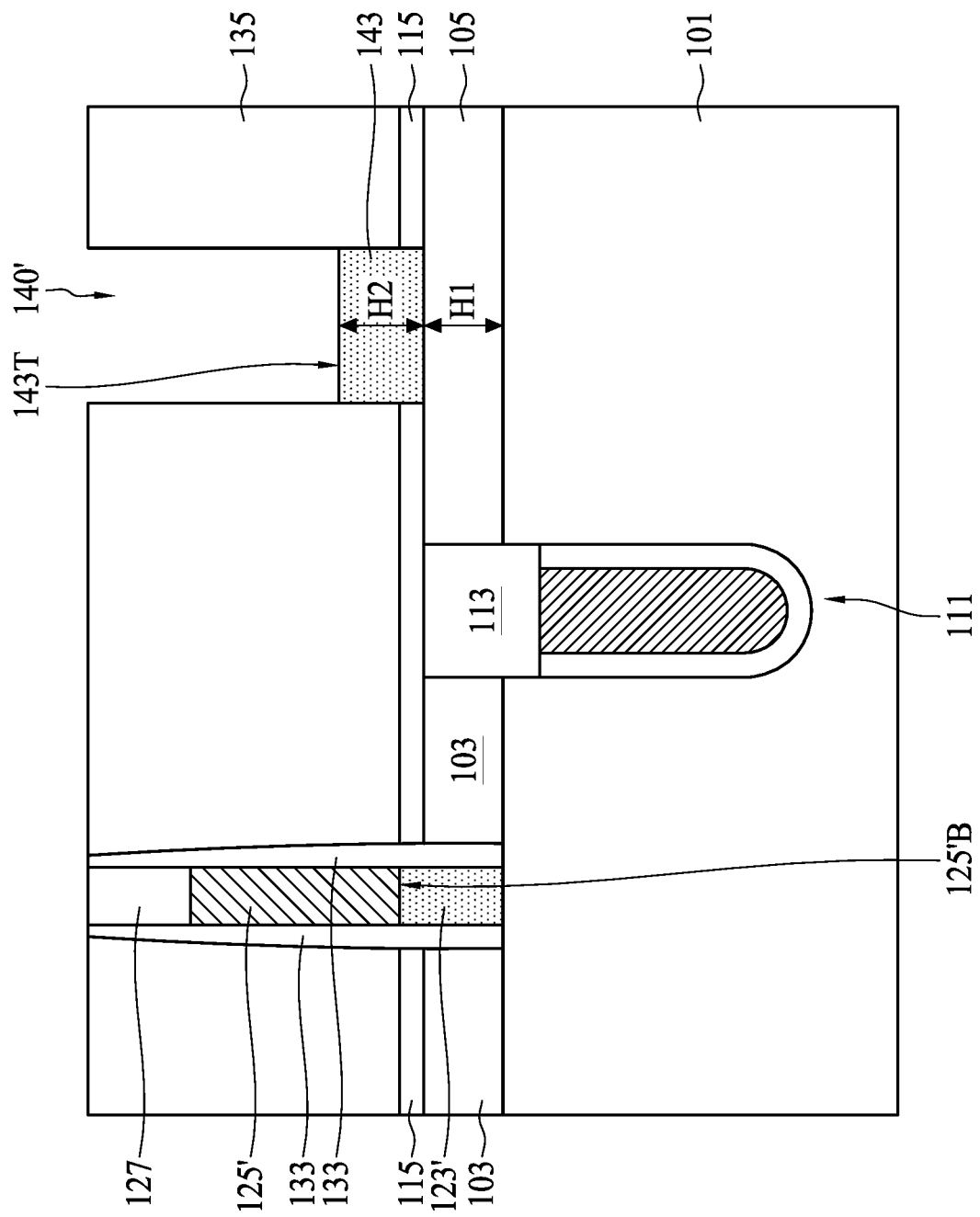
FIG. 10 is a cross-sectional view illustrating an intermediate stage in the formation of a semiconductor device, in accordance with some embodiments.

Next, the epitaxial structure 143 is formed in the opening 140, such that a reduced opening 140' is obtained, as shown in FIG. 10 in accordance with some embodiments. It should be noted that the epitaxial structure 143 is formed over the drain region 105, in accordance with some embodiments. In some embodiments, the epitaxial structure 143 is in direct contact with the drain region 105. The respective step is illustrated as the step S23 in the method 10 shown in FIG. 2.

In some embodiments, the epitaxial structure 143 includes silicon, and the epitaxial structure 143 is epitaxially grown over the drain region 105. It should be noted that the top surface 143T of the epitaxial structure 143 is higher than the bottom surface 125'B of the bit line 125' (i.e., the interface between the bit line 125' and the remaining epitaxial structure 123'), in accordance with some embodiments.

After the epitaxial structure 143 is formed, the spacers 145 are formed so as to line the sidewalls of the reduced opening 140', and the capacitor contact 147 is formed so as to be surrounded by the spacers 145, as shown in FIG. 1 in accordance with some embodiments. In some embodiments, the capacitor contact 147 and the spacers 145 are positioned over the epitaxial structure 143. The respective step is illustrated as the step S25 in the method 10 shown in FIG. 2.

Some processes and materials used to form the spacers 145 are similar to, or the same as, those used to form the spacers 133 and the detailed descriptions thereof are not repeated herein. In some embodiments, a spacer material (not shown) is formed to conformally cover the top surface of the epitaxial structure 143, the sidewalls of the reduced opening 140', and the top surface of the ILD structure 135. Next, the spacer material is partially removed by performing an etching process, and portions of the epitaxial structure 143 are exposed after the etching process is performed. In some embodiments, the etching process is an anisotropic etching process, which removes a similar amount of spacer material vertically in all places, leaving the spacers 145.

Moreover, in some embodiments, the capacitor contacts 147 are made of poly-crystalline silicon, tungsten (W), aluminum (Al), copper (Cu), nickel (Ni), cobalt (Co), another conductive material, or a combination thereof, and the capacitor contacts 147 are formed by a deposition process. The deposition process may include a CVD process, a PVD process, a spin-coating process, or another applicable process. Next, a planarization process, such as a CMP process, may be performed such that the top surfaces of the capacitor contacts 147 are coplanar with the top surface of the ILD structure 135.

After the capacitor contacts 147 are formed, the semiconductor device 100 is obtained. In the present embodiment, the semiconductor device 100 is a dynamic random access memory (DRAM).

Embodiments of the semiconductor device 100 and the method for forming the same are provided. The semiconductor device 100 includes the bit line 125' over the source region 103, the epitaxial structure 143 over the drain region 105, and the capacitor contact 147 over the epitaxial structure 143. Since there is a vertical offset between the bit line contact (i.e., the epitaxial structure 123' electrically connected to the bit line 125') under the bit line 125' and the capacitor contact 147, the capacitance between the bit line contact (i.e., the epitaxial structure 123') and the capacitor contact 147 may be reduced. As a result, the operation speeds of the semiconductor device 100 may be increased, and the overall device performance may be improved.

Moreover, since the dielectric cap layer 127 is formed over the bit line 125', the thickness of the dielectric cap layer 127 can be modified such that the top surface 127T of the dielectric cap layer 127 is level with the top surface 147T of the capacitor contact 147. Since the semiconductor device 100 has a flat top surface, the design and formation of the components above the semiconductor device 100 can be more easily achieved.

In addition, the thickness of the capacitor contact 147 can be reduced since the epitaxial structure 143 is formed under the capacitor contact 147. Therefore, the aspect ratio of the capacitor contact 147 may be reduced, and the etching process for forming the capacitor contact 147 may become easier. Furthermore, since the epitaxial structure 143 is formed before the capacitor contact 147, the epitaxial structure 143 may be used as an etch stop layer (ESL) for the etching process for forming the capacitor contact 147. As a result, the drain region 105 in the semiconductor substrate 101 can be protected by the epitaxial structure 143.

In one embodiment of the present disclosure, a semiconductor device is provided. The semiconductor device includes a source region and a drain region formed in a semiconductor substrate, and a bit line formed over the source region. The semiconductor device also includes a first epitaxial structure formed over the drain region, and a capacitor contact formed over the first epitaxial structure. A bottom surface of the capacitor contact is higher than a bottom surface of the bit line.

In another embodiment of the present disclosure, a semiconductor device is provided. The semiconductor device includes a source region and a drain region formed in a semiconductor substrate, and a bit line formed over the source region. The semiconductor device also includes a first dielectric cap layer formed over the bit line, and a first epitaxial structure formed over the drain region. The semiconductor device further includes a capacitor contact formed over the first epitaxial structure. A top surface of the first epitaxial structure is higher than a bottom surface of the bit line, and a top surface of the capacitor contact is level with a top surface of the first dielectric cap layer.

In one embodiment of the present disclosure, a method for forming a semiconductor device is provided. The method includes forming a source region and a drain region in a semiconductor substrate, and forming a bit line over the source region. The method also includes growing a first epitaxial structure over the drain region. A top surface of the first epitaxial structure is higher than a bottom surface of the bit line. The method further includes forming a capacitor contact over the first epitaxial structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for forming a semiconductor device, comprising:
   forming a source region and a drain region in a semiconductor substrate;
   forming a bit line over the source region;
   growing a first epitaxial structure over the drain region, wherein a top surface of the first epitaxial structure is higher than a bottom surface of the bit line;
   forming a capacitor contact over the first epitaxial structure;
   forming a buffer layer covering the source region and the drain region;
   partially removing the buffer layer and the source region to form a first opening; and
   growing a second epitaxial structure in the first opening before the bit line is formed;
   wherein the forming the bit line comprises:
   forming a conductive layer over the second epitaxial structure;
   forming a dielectric cap layer partially covering the conductive layer; and
   etching the conductive layer and the second epitaxial structure using the dielectric cap layer as a mask such that the bit line is formed, wherein the second epitaxial structure is separated from the source region and the buffer layer by a gap after the bit line is formed.

2. The method for forming a semiconductor device of claim 1, further comprising:
   forming an interlayer dielectric (ILD) structure surrounding the bit line; and partially removing the ILD structure to form a second opening exposing the drain region.

3. The method for forming a semiconductor device of claim 2, wherein the first epitaxial structure is grown in the second opening.

4. The method for forming a semiconductor device of claim 2, further comprising: forming a spacer lining sidewalls of the second opening after the first epitaxial structure is formed, wherein the capacitor contact is formed over and in direct contact with the first epitaxial structure, and the capacitor contact is surrounded by the spacer.

* * * * *